United States Patent
Chen et al.

(10) Patent No.: US 7,710,774 B2
(45) Date of Patent: May 4, 2010

(54) NAND TYPE MULTI-BIT CHARGE STORAGE MEMORY ARRAY AND METHODS FOR OPERATING AND FABRICATING THE SAME

(75) Inventors: Yin Jen Chen, Hsinchu (TW); Chun Lein Su, Hsinchu (TW); Ming Shiang Chin, Hsinchu (TW); Chih Chieh Yeh, Hsinchu (TW); Tzung Ting Han, Hsinchu (TW)

(73) Assignee: Macronix International Co., Ltd., Hinshcu (TW)

( * ) Notice: Subject to any disclaimer, the term of this patent is extended or adjusted under 35 U.S.C. 154(b) by 176 days.

(21) Appl. No.: 11/285,919

(22) Filed: Nov. 23, 2005

(65) Prior Publication Data

US 2007/0115723 A1 May 24, 2007

(51) Int. Cl.
*G11C 16/04* (2006.01)
*G11C 5/06* (2006.01)
(52) U.S. Cl. .............................. 365/185.05; 365/185.17
(58) Field of Classification Search ............ 365/185.05, 365/185.11, 185.12, 185.17, 185.03
See application file for complete search history.

(56) References Cited

U.S. PATENT DOCUMENTS

| | | | | |
|---|---|---|---|---|
| 5,392,238 A | * | 2/1995 | Kirisawa | 365/185.13 |
| 5,680,347 A | * | 10/1997 | Takeuchi et al. | 365/185.17 |
| 5,734,609 A | * | 3/1998 | Choi et al. | 365/185.17 |
| 5,923,587 A | * | 7/1999 | Choi | 365/185.11 |
| 6,650,567 B1 | | 11/2003 | Cho et al. | |
| 6,670,240 B2 | | 12/2003 | Ogura et al. | |
| 6,819,590 B2 | * | 11/2004 | Goda et al. | 365/185.03 |
| 2004/0145024 A1 | * | 7/2004 | Chen et al. | 257/390 |
| 2004/0145950 A1 | * | 7/2004 | Yeh et al. | 365/185.28 |

* cited by examiner

*Primary Examiner*—Jung H. Hur
(74) *Attorney, Agent, or Firm*—Stout, Uxa, Buyan & Mullins, LLP

(57) ABSTRACT

A NAND type multi-bit charge storage memory array comprises a first and a second memory strings each of which includes one or more charge storage memory cells and two select transistors. The charge storage memory cells are connected in series to form a memory cell string. The two select transistors are connected in series to both ends of the memory cell string, respectively. The NAND type multi-bit charge storage memory array further comprises a shared bit line and a first and a second bit lines. The shared bit line is connected with the first ends of the first and the second memory strings. The first and the second bit lines are connected to the second ends of the first and the second memory strings, respectively. The first select transistor and the second select transistor of each memory string are controlled by a first and a second select transistor control lines, respectively.

6 Claims, 13 Drawing Sheets

NAND TYPE MULTI-BIT CHARGE STORAGE MEMORY ARRAY AND METHODS FOR OPERATING AND FABRICATING THE SAME

BACKGROUND OF THE INVENTION

1. Field of the Invention

The present invention relates generally to semiconductor memories, and more particularly, to a NAND type multi-bit charge storage memory array and methods for operating and fabricating the same.

2. Description of the Related Art

Demand for flash memories is growing rapidly due to the wide range of portable and embedded products with increased storage requirements. NAND type flash memory is one type of memory structure that is commonly used, however, conventional NAND type flash memory arrays will require many select transistors. This is especially true for multi-bit per cell applications.

A conventional NAND floating gate memory array 100 is depicted in FIG. 1. The NAND floating gate memory array 100 includes four memory strings each of which connects one string select transistor, one ground select transistor, and six floating gate memory cells in series. Each of the four memory strings has one end connected to a bit line and the other end connected to a common source line. The drain regions of the string select transistors $SST_1$, $SST_2$, $SST_3$, and $SST_4$ are respectively connected to the bit lines $BL_1$, $BL_2$, $BL_3$, and $BL_4$ through contacts. The source regions of the ground select transistors $GST_1$, $GST_2$, $GST_3$, and $GST_4$ are connected to the common source line.

As shown in FIG. 1, the string select transistors $SST_1$, $SST_2$, $SST_3$, and $SST_4$ are controlled by the String Select line (SSL), whereas the ground select transistors $GST_1$, $GST_2$, $GST_3$, and $GST_4$ are controlled by the Ground Select line (GSL). The twenty-four floating gate memory cells of the four memory strings are arranged in 4 columns and six rows. Each floating gate memory row is driven by a word line (WL). For example, the floating gate memory cells $M_{11}$, $M_{21}$, $M_{31}$, and $M_{41}$ of the first row are driven by the word line $WL_1$.

Since the conventional NAND floating gate memory array 100 uses floating gate memory cells to store data, it is only capable of one bit per cell operation. In addition, the layout of the conventional NAND floating gate memory array 100 requires double polysilicon layers and double metal layers, which complicates the fabrication process. Furthermore, due to the small contact pitch between bit lines, the bit line contact process of the conventional NAND floating gate memory array 100 needs to be very precise.

In view of the foregoing, there is a need for a new NAND memory array and methods for operating and fabricating such a NAND memory array so that the NAND memory array is capable of multiple bits per cell operation and requires simple fabrication process.

SUMMARY OF THE INVENTION

Broadly speaking, the present invention fills this need by providing a NAND type multi-bit charge storage memory array. A program method, a read method, and a fabrication method for the NAND type multi-bit charge storage memory array are also disclosed.

In accordance with one aspect of the present invention, a NAND type multi-bit charge storage memory array is provided. The NAND type multi-bit charge storage memory array comprises a first and a second memory string each of which includes one or more charge storage memory cells and first and second select transistors. For each of the first and the second memory strings, the one or more charge storage memory cells are connected in series to form a memory cell string, and the first and the second select transistors are connected in series to both ends of the memory cell string, respectively. The NAND type multi-bit charge storage memory array further comprises a shared bit line and first and second bit lines. The shared bit line is connected with the first ends of the first and the second memory strings. The first bit line is connected to the second end of the first memory string, whereas the second bit line is connected to the second end of the second memory string.

The first select transistors of the first and the second memory strings are controlled by a first select transistor control line, while the second select transistors of the first and the second memory strings are controlled by a second select transistor control line. In one embodiment, the charge storage memory cells are programmed by hot-hole injection nitride electron storage (PHINES) cells. In accordance with another aspect of the present invention, a method for programming a NAND type multi-bit charge storage memory array is described. A NAND type multi-bit charge storage memory array comprises a first and a second memory strings each of which includes one or more charge storage memory cells and first and second select transistors. For each of the first and the second memory strings, the one or more charge storage memory cells are connected in series to form a memory cell string, and the first and the second select transistors are connected in series to both ends of the memory cell string, respectively. The NAND type multi-bit charge storage memory array further comprises a shared bit line and a first and a second bit lines. The shared bit line is connected with the first ends of the first and the second memory strings. The first bit line is connected to the second end of the first memory string, whereas the second bit line is connected to the second end of the second memory string. The first select transistors of the first and the second memory strings are controlled by a first select transistor control line, while the second select transistors of the first and the second memory strings are controlled by a second select transistor control line. The first memory string and the second memory string have identical number of charge storage memory cells that are arranged in columns and rows.

After the NAND type multi-bit charge storage memory array is provided, a first program cell from the first memory string and a second program cell from the second memory string are selected such that the first program cell is in the same row as the second program cell, and the first program cell and the second program cell are controlled by a same program word line. The other memory cells of the first memory string and the second memory string that are located between one of the first program cell and the second program cell and one of the first and the second select transistors of each of the first memory string and the second memory string are identified as the pass cells. Then, a program bit from each of the first program cell and the second program cell are identified, wherein the program bit of each of the first program cell and the second program cell is located at a side that is connected to the shared bit line through one of the first and the second select transistors and the pass cells if any.

Next, the first select transistors and the second select transistors of the first memory string and the second memory string are turned on by applying a first select transistor control voltage and a second select transistor control voltage to the first select transistor control line and the second transistor control line, respectively. A word line control voltage is applied to the word lines of the pass cells. A first programming voltage is applied to the shared bit line, and second and third programming voltages are applied respectively to the first bit line and the second bit line.

In accordance with another aspect of the present invention, a method for reading a NAND type multi-bit charge storage memory array is described. A NAND type multi-bit charge storage memory array comprises a first and a second memory strings each of which includes one or more charge storage memory cells and a first and a second select transistors. For each of the first and the second memory strings, the one or more charge storage memory cells are connected in series to form a memory cell string, and the first and the second select transistors are connected in series to both ends of the memory cell string, respectively. The NAND type multi-bit charge storage memory array further comprises a shared bit line and first and second bit lines. The shared bit line is connected with the first ends of the first and the second memory strings. The first bit line is connected to the second end of the first memory string, whereas the second bit line is connected to the second end of the second memory string. The first select transistors of the first and the second memory strings are controlled by a first select transistor control line, while the second select transistors of the first and the second memory strings are controlled by a second select transistor control line. The first memory string and the second memory string have identical number of charge storage memory cells that are arranged in columns and rows.

After the NAND charge storage memory array is provide, a first read cell from the first memory string and a second read cell from the second memory string are selected such that the first read cell is in the same row as the second read cell, and the first read cell and the second read cell are controlled by a read word line. The other memory cells of the first memory string and the second memory string that are located between one of the first read cell and the second read cell and one of the first select transistor and the second select transistor of each of the first memory string and the second memory string are identified as the pass cells. Then, a read bit from each of the first read cell and the second read cell is identified such that the read bit of each of the first read cell and the second read cell is located at a side that is connected to the shared bit line through one of the first and the second select transistors and the pass cells if any.

The first select transistors of the first memory string and the second memory string are turned on by applying a first select transistor control voltage and a second select transistor control voltage to the first select transistor control line and the second transistor control line, respectively. A word line control voltage is applied to the word lines of the pass cells. A first read voltage is applied to the shared bit line, and a second read voltage is applied the first bit line and the second bit line.

In accordance with another aspect of the present invention, a method for fabricating a NAND charge storage memory array is described. A substrate with a first, second, and third isolation regions is provided. The substrate is then implanted such that first and second first impurity doped regions are formed on the substrate between the first and the second isolation regions and between the second and the third isolation regions. Next, charge layers are formed over the first and second first impurity doped regions; a polysilicon layer is formed over the charge layers and the three isolation regions. Then, the charge layers and the polysilicon layer are patterned and etched to form rows of the polysilicon lines and having the charge storage layers under the rows of the polysilicon lines such that a first end, a second end, and the portions of the first and second first impurity doped regions are exposed. The exposed portions of the first and second first impurity doped regions are implanted to form second impurity doped regions. An oxide layer is formed over the polysilicon layer, the second impurity doped regions, and the isolation regions. Next, a first contact, a second contact, and a third contact are formed through the oxide layer such that, (a) the first contact connects to the second impurity doped regions near the first end of the first and second impurity doped regions that extend along a length of the substrate, where the length of the substrate is perpendicular to the rows of polysilicon lines that are along the width of the substrate; (b) the second contact connects to the second impurity doped regions near the second end; and (c) the third contact connects to the second impurity doped regions near the first end. Then, a metal layer is formed over the oxide layer such that the metal layer connects with the first contact, the second contact, and the third contact. The metal layer is patterned and etched to form a first, second, and third bit lines along the length of the substrate such that the first, second, and third bit lines connect with the first, second, and third contacts, respectively. The rows of the polysilicon lines are word lines.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE EXEMPLARY EMBODIMENTS

Reference is made in detail to embodiments of the invention. While the invention is described in conjunction with the embodiments, the invention is not intended to be limited by these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 1:
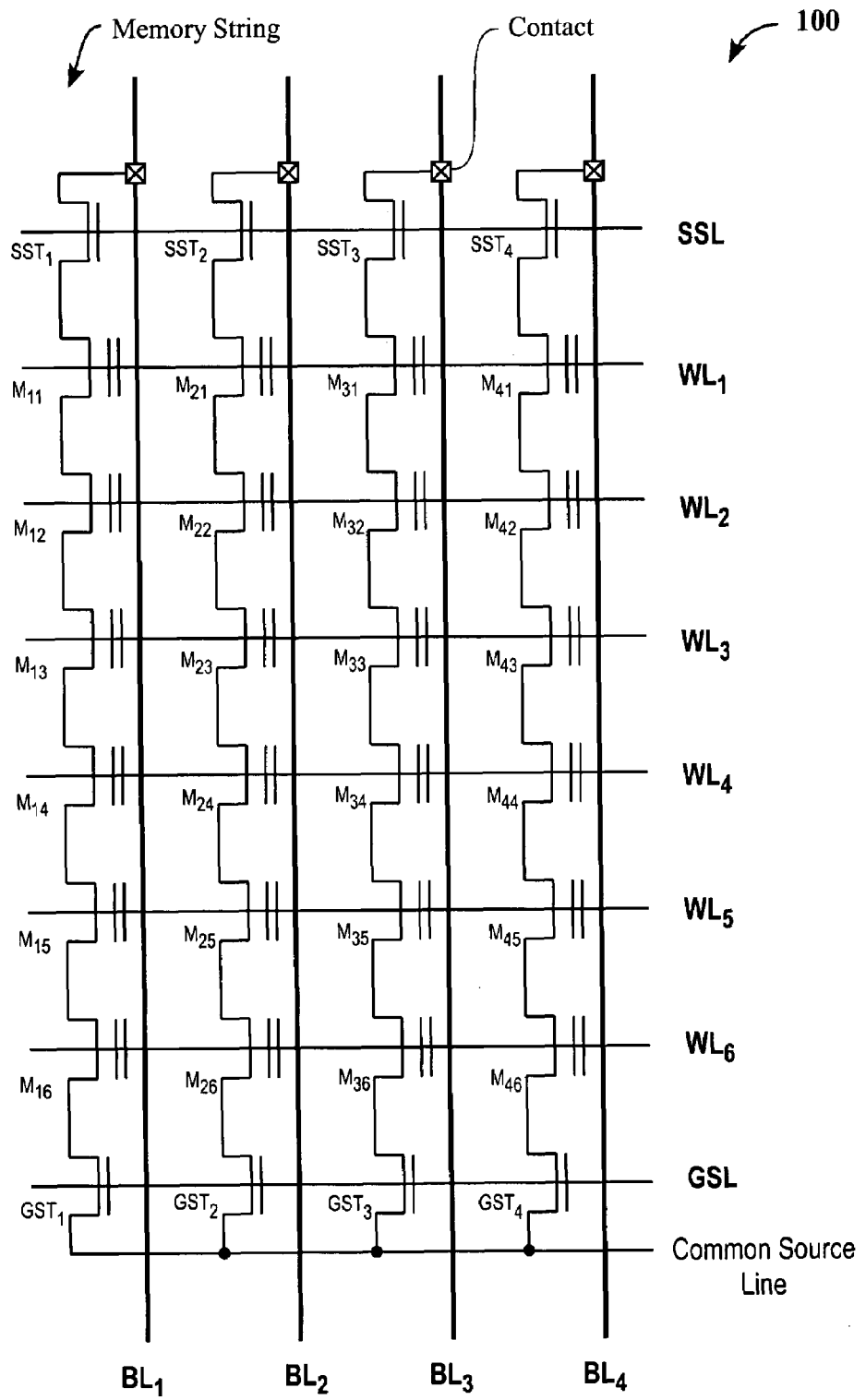
FIG. 1 shows a conventional NAND floating gate memory array with four memory strings.
Figure 2:
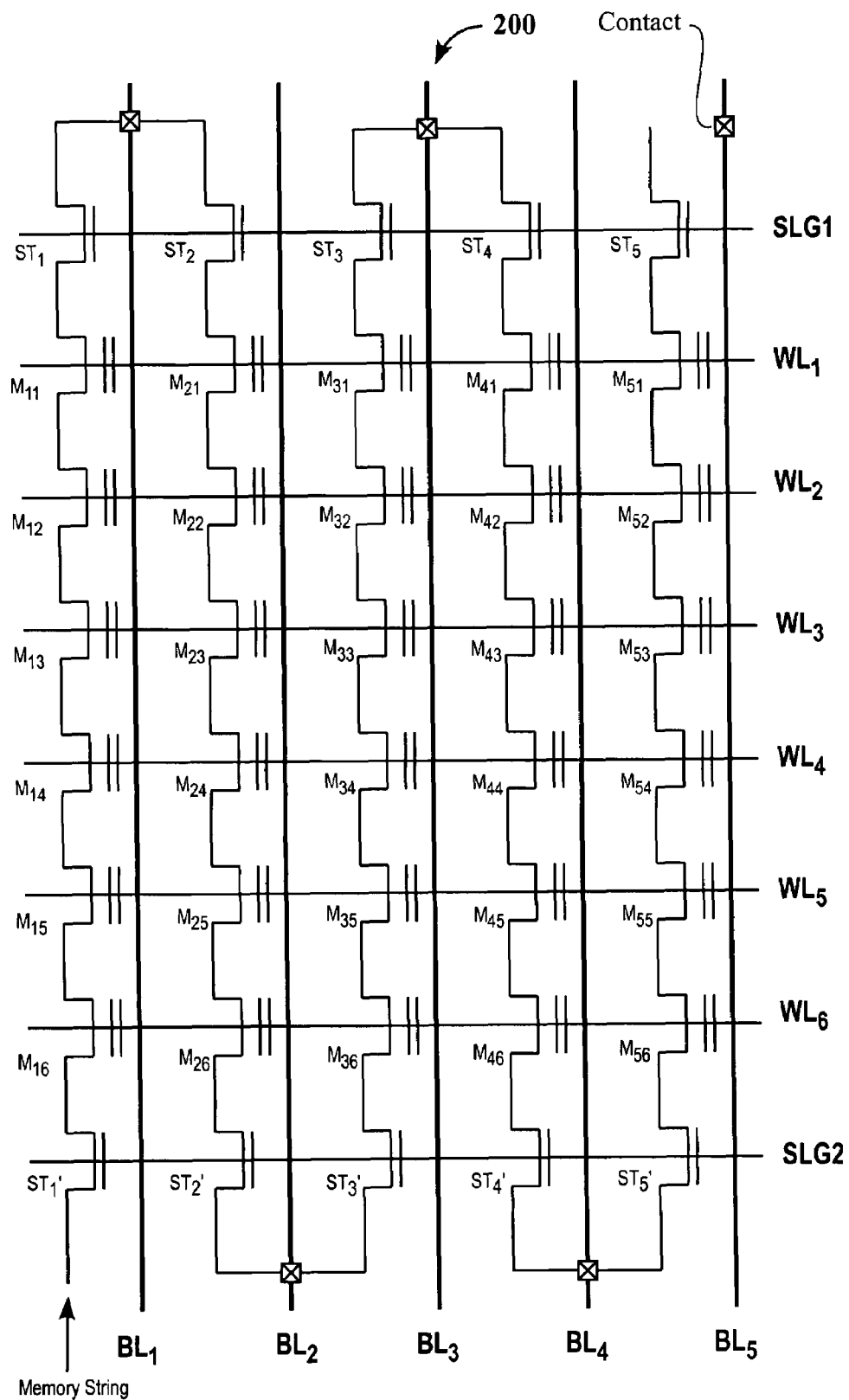
FIG. 2 shows a NAND type multi-bit charge storage memory array with five memory strings in accordance with one embodiment of the present invention.

FIG. 2 shows a NAND type multi-bit charge storage memory array 200 in accordance with one embodiment of the present invention. The NAND charge storage memory array 200 includes five memory strings each of which connects one select transistor, six charge storage memory cells, and another select transistor in series. For example, the left most memory string serially connects the select transistor $ST_1$, the six charge storage memory cells $M_{11}, M_{12}, \ldots M_{16}$, and the select transistor $ST_1'$. The select transistors and the charge storage memory cells of the five memory strings are arranged into columns and rows. The select transistors or the charge storage memory cells of each row are controlled by a control line.

As shown in FIG. 2, the five select transistors $ST_1$, $ST_2, \ldots ST_5$ of the first row are controlled by the select control line SLG1, whereas the five select transistors $ST_1'$, $ST_2'$, ... $ST_5'$ of the last row are controlled by the select control line SLG2. The charge storage memory cells $M_{11}, M_{12}, \ldots M_{56}$, controlled by word lines $WL_1, WL_2, \ldots W_6$, are capable of 2 bits per cell operation. In one embodiment, the charge storage memory cells $M_{11}, M_{12}, \ldots M_{56}$ are programming by hot-hole injection nitride electron storage (PHINES) cells. In the examples given, the exemplary charge storage memory cells are not intended to be exhaustive nor limit the invention to the precise material disclosed.

The NAND type multi-bit charge storage memory array 200 includes five bit lines: $BL_1, BL_2, \ldots BL_5$. Two adjacent memory strings share one bit line that is located between the two adjacent memory strings. Each bit line connects to its two adjacent memory strings through a contact. A memory string, which is located between two bit lines, connects to one of its adjacent bit line at one end and connects to another adjacent bit line at the other end.

Because the adjacent bit lines shown in 200 have their contacts alternatively located at the opposite ends of the two adjacent bit lines, the contact pitch between bit lines is doubled, as compared with the contact pitch of the conventional NAND floating gate memory array 100. Thus, the bit line contact process for the NAND charge storage memory array is relaxed. Furthermore, because of the use of the new array architecture of the charge storage memory cells instead of the conventional floating gate memory cells, only one poly process and one metal layer process are required for the present invention. Hence, the need for a damascene process can be eliminated. As a result, the present invention has lower production cost and an easier fabrication process. In addition, the new array architecture of NAND type multi-bit charge storage memory array 200 also has lower select transistor overhead: about 15.7% select transistor overhead, compared with the conventional NAND type 2 bit per cell flash memory.

Figure 3:
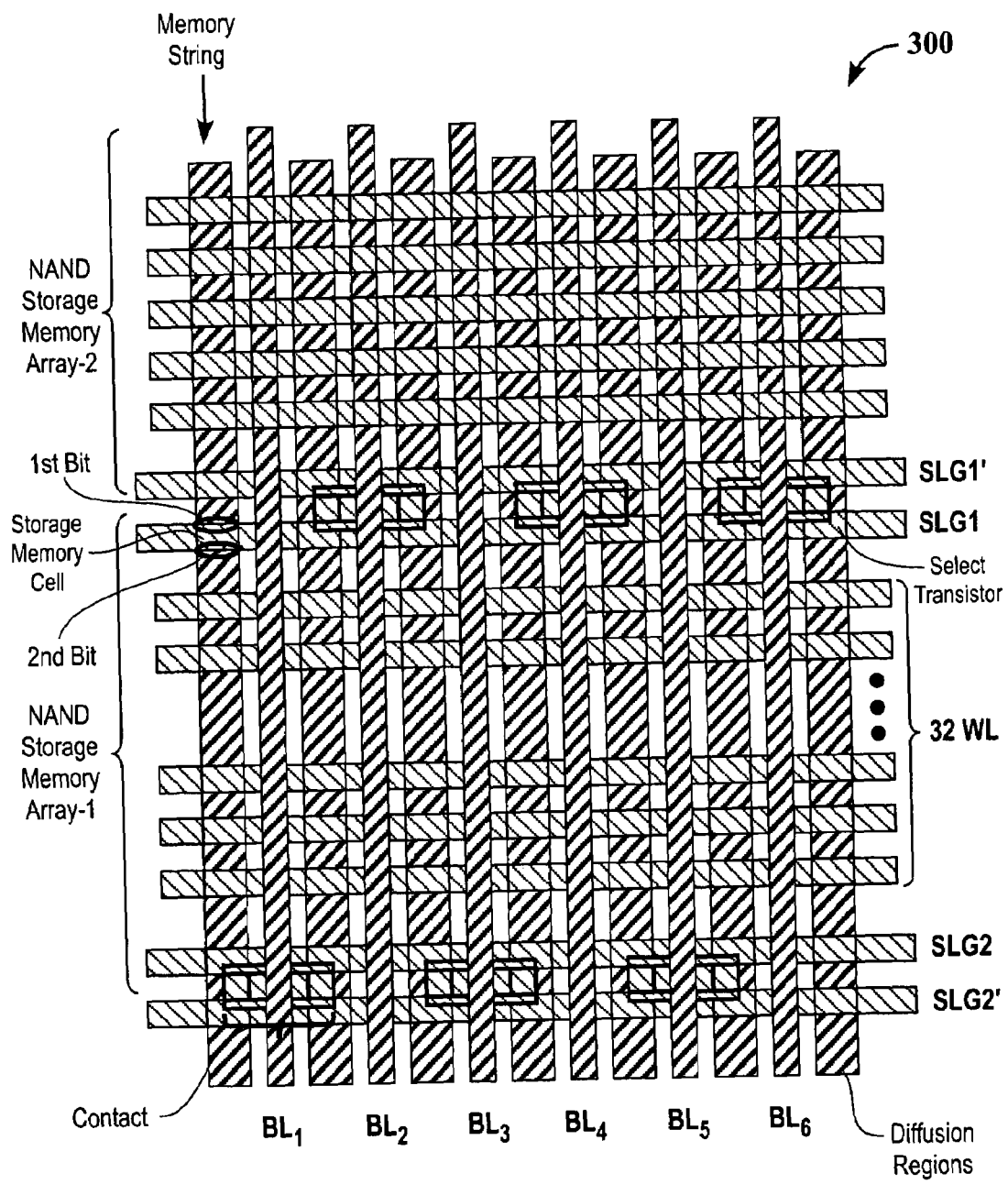
FIG. 3 shows the basic layout of a NAND type multi-bit charge storage memory array structure in accordance with one embodiment of the present invention.

FIG. 3 shows a basic layout of a NAND charge storage memory array structure 300 in accordance with one embodiment of the present invention. The NAND charge storage memory array structure 300 shows a NAND charge storage memory array_1 and partial of the NAND charge storage memory array_2.

The NAND charge storage memory array_1 includes seven memory strings, six bit lines ($BL_1, BL_2, \ldots BL_6$), six contacts, thirty-two word lines, and two select transistor control lines (SLG1 and SLG2). The select transistor control line SLG1' is used to control the select transistors for the NAND charge storage memory array_2, while the select transistor control line SLG2' is for the NAND charge storage memory array located below the NAND charge storage memory array_1.

For the NAND charge storage memory array_1, each of the seven memory strings sequentially connects one select transistor, thirty-two charge storage memory cells, and another select transistor in series. Each charge storage memory cell, located at an intersection between a diffusion region and a word line, is capable of 2 bits per cell operations. For the charge storage memory cell located at the top of the left most memory string, the locations of its 2 bits are indicated by oval circles in FIG. 3. Each select transistor of a memory string is located at the intersection between a diffusion region and a select transistor control line.

As shown in FIG. 3, two adjacent memory strings share one of the bit lines ($BL_1, BL_2, \ldots B_6$) through one of the six contacts. In one embodiment, the six bit lines ($BL_1, BL_2, \ldots B_6$) are made of metal layers. In one embodiment, the word lines and the select transistor control lines are made of polysilicon.

Figure 4:
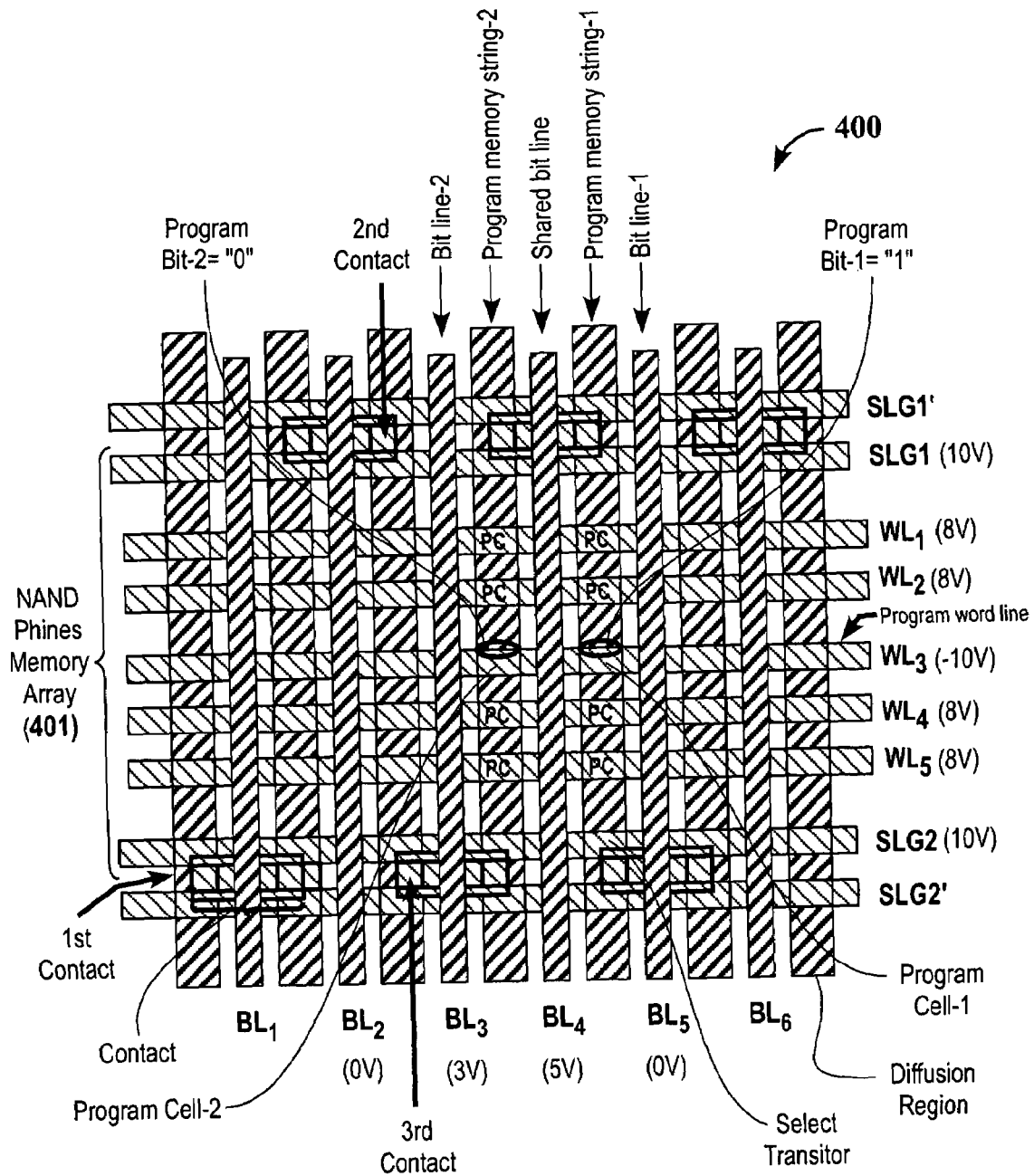
FIG. 4 illustrates an exemplary method for programming a NAND programming by hot-hole injection nitride electron storage (PHINES) memory array in accordance with one embodiment of the present invention.

FIG. 4 illustrates an exemplary method for programming a NAND PHINES memory array 401 in accordance with one embodiment of the present invention. The NAND PHINES memory array structure 400 includes a NAND PHINES memory array 401 and two select transistor control lines SLG1' and SLG2' that are respectively for the NAND PHINES memory arrays located above and below the NAND PHINE memory array 401. The NAND PHINES memory array 401 includes seven memory strings, five word lines ($WL_1, WL_2, \ldots WL_5$), two select transistor control lines (SLG1 and SLG2), and six contacts. Each memory string sequentially connects one select transistor, five PHINES memory cells, and another select transistor in series. The select transistors and the PHINES memory cells of the seven memory strings are arranged in columns and rows.

For the sake of easy decoding, every program operation will program two adjacent bits that are located at the same side of two PHINES memory cells belonging to two adjacent memory strings in the same row by applying the programming voltages to four bit lines.

As shown in FIG. 4, the program cell_1 and the program cell_2 are selected from the two adjacent program memory string_1 and the program memory string_2, respectively. All the other memory cells of the program memory string_1 and the program memory string_2 that are located between one of the program cell_1 and the program cell_2 and one of the select transistors are identified as pass cells. The pass cells of the program memory string_1 and the program memory string_2 are indicated in FIG. 4 by "PC".

Next, the program bits need to be identified from the program cell_1 and the program cell_2. The locations of the program bit_1 of the program cell_1 and the program bit_2 of the program cell_2 are indicated in FIG. 4 by oval circles. The program cell_1 and the program cell_2 are controlled by the program word line $WL_3$. In this embodiment, the program bit_1 needs to be programmed to "1" and the program bit_2 needs to be programmed to "0". The bit lines $BL_2, BL_3, BL_4$, and $BL_5$ are applied with the programming voltages.

In order to apply appropriate programming voltages to the terminals of the program cell_1 and the program cell_2, the select transistors and the pass cells of the program memory string_1 and the program memory string_2 need to be turned on. Thus, the word lines ($WL_1, WL_2, WL_4$, and $WL_5$) of the pass cells are applied with a bias of 8V and the select transistor control lines SLG1 and SLG2 are applied with a bias of 10V. The program word line $WL_3$ is applied with a bias of −10V.

To program a program cell of the NAND PHINES memory array 401, the program bit side of the program cell needs to be applied with a programming voltage of 5V. The un-program bit side needs to be applied with a programming voltage of 0V or 3V, depending upon the program value for the program bit. If the program value of the program bit is "1", the un-program bit side of a program cell is applied with a programming voltage of 0V. Otherwise, the un-program bit side of a program cell is applied with a programming voltage of 3V.

The bit line $BL_4$, which is shared by the program bit_1 and the program bit_2, is called the shared bit line. The shared bit line $BL_4$ will provide the programming voltage through pass cells for the program bit sides of the program cell_1 and the program cell_2. The bit line $BL_5$, which will provide the programming voltage through pass cells for the un-program bit side of the program cell_1, is identified as the bit line_1. The bit line $BL_3$, which will provide the programming voltage through pass cells for the un-program bit side of the program cell_2, is identified as the bit line_2. Since the program bit_1 needs to be programmed to "1" and the program bit_2 needs to be programmed to "0", the programming voltages applied for the bit line_1 and the bit line_2 will be 0V and 3V, respectively. The programming voltage applied to the shared bit line will be 5V.

For the program cell_1, its program bit side is applied with 5V; the un-program bit side is applied with 0V. Thus, the program bit_1 of the program cell_1 is programmed to "1". For the program cell_2, its program bit side is applied with 5V and its un-program bit side is applied with 3V. As a result, the program bit_2 of the program cell_2 is programmed to "0".

If the bit line_2 ($BL_3$) is applied with a programming voltage of 0V, the un-program bit side of the program cell_2 will have 0V, resulting the program bit_2 of the program cell_2 to be programmed to "1". If the bit line_1 ($BL_5$) is applied with a programming voltage of 3V, the un-program bit side of the program cell_1 will have 3V. Thus, the program bit_1 of the program cell_1 will be programmed to "0". Hence, the programming voltages of the bit line_1 and the bit line_2 are determined by the programming value for the program bit_1 and the program bit_2.

As mentioned above, besides the programming voltages applied to the shared bit line $BL_4$, the bit line_1($BL_3$), and the bit line_2($BL_5$), a fourth bit line that is adjacent to either the bit line_1 or the bit line_2 can be applied with a programming voltage for the sake of easy decoding. In this embodiment, the fourth bit line is the bit line $BL_2$ that is applied with a programming voltage of 0V. In another embodiment, the fourth bit line can be the bit line $BL_6$.

Figure 5:
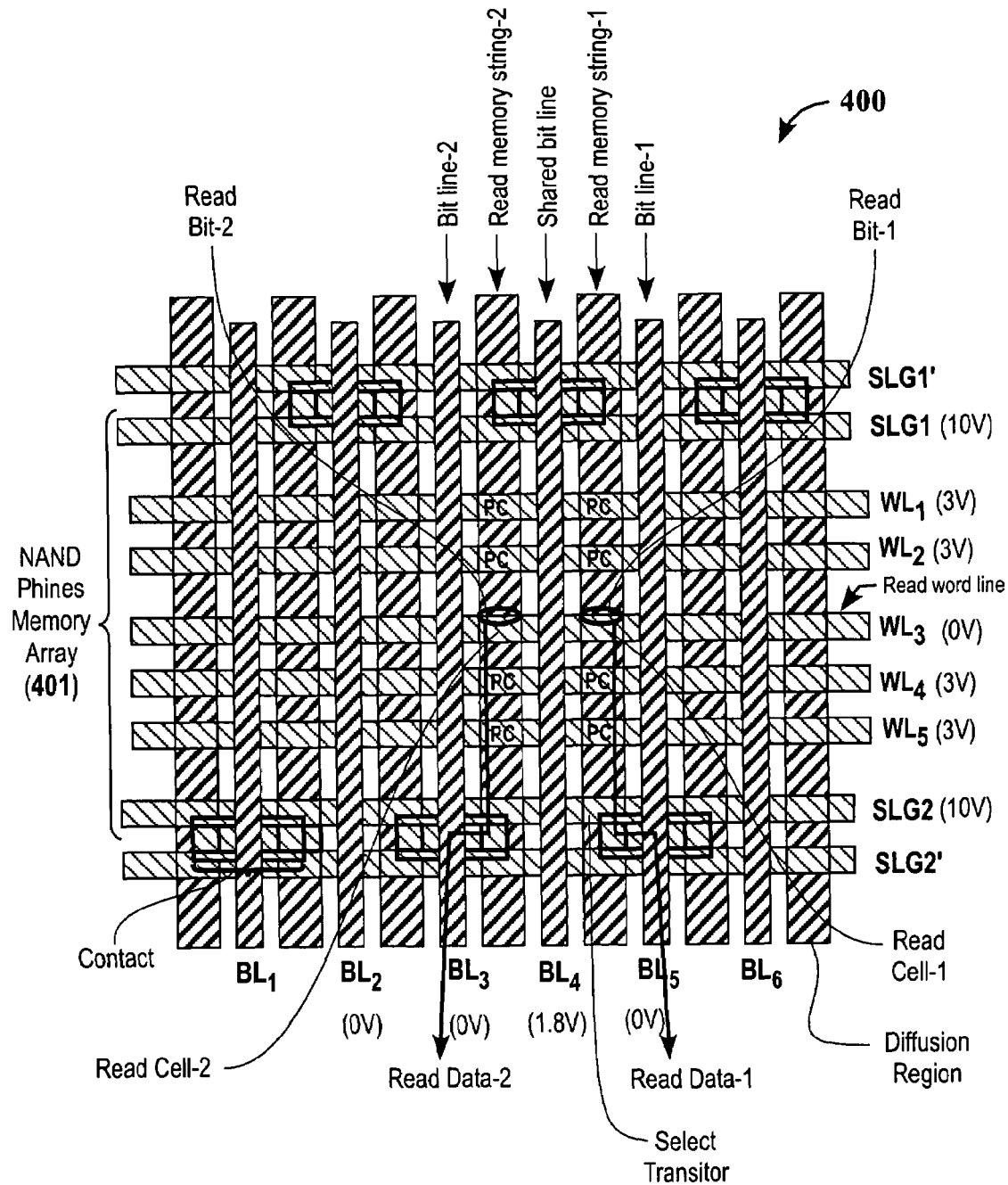
FIG. 5 illustrates an exemplary method for reading a NAND PHINES memory array in accordance with one embodiment of the present invention.

FIG. 5 shows an exemplary method for reading a NAND PHINES memory array 401 in accordance with one embodiment of the present invention. The layout of the NAND PHINES memory array structure 400 and the NAND PHINES memory array 401 are described above. For the sake of easy decoding, every read operation will read two adjacent bits that are located at the same side of two PHINES memory cells belonging to two adjacent memory strings in the same row by applying the read voltages to four bit lines.

The read bit_1 of the read cell_1 and the read bit_2 of the read cell_2 are selected from the two adjacent read memory string_1 and the read memory string_2, respectively. The other memory cells of the read memory string_1 and the read memory string_2 that are located between one of the select transistors and one of the read cell_1 and the read cell_2 are identified as pass cells. The pass cells of the read memory string_1 and the read memory string_2 are indicated by the "PC" in FIG. 5. The read cell_1 and the read cell_2 are in the same row and controlled by the read word line ($WL_3$).

The bit line $BL_4$ is a shared bit line for the read bit_1 of the read cell_1 and the read bit_2 of the read cell_2. The shared bit line $BL_4$ will provide the read voltage through pass cells for the read bit sides of the read cell_1 and the read cell_2. The bit line $BL_5$, which will provide the read voltage through pass cells for the un-read bit side of the read cell_1, is identified as the bit line_1. The bit line $BL_3$, which will provide the read voltage through pass cells for the un-read bit side of the read cell_2, is identified as the bit line_2.

In order to read a bit of a read cell in the NAND PHINES memory array 401, the read bit side of the read cell needs to be applied with a read voltage of 1.8V, the un-read bit side of the read cell needs to be applied with a read voltage of 0V. Therefore, to read the read bit_1 of the read cell_1 and the read bit_2 of the read cell_2, the bit line_1 ($BL_5$) and the bit line_2 ($BL_3$) are applied with 0V, while the shared bit line $BL_4$ is applied with 1.8V. The read word line ($WL_3$) is applied with 0V. The word lines ($WL_1$, $WL_2$, $WL_4$, and $WL_5$) of the pass cells are applied with 3V to turn them on. All of the select transistors that are controlled by the SLG1 and SLG2 are turned on due to the select transistor control voltage of 10V. Thus, the pass cells pass the read voltages of the bit line_2 ($BL_3$), the shared bit line ($BL_4$), and the bit line_1 ($BL_5$) to the read bit sides and the un-read bit sides of the read cell_1 and the read cell_2. The read bit sides of the read cell_1 and the read cell_2 have the read voltage of 1.8V and the un-read bit sides of the read cell_1 and the read cell_2 are 0V. As indicated by arrows in FIG. 5, the data stored at the read bit_1 and the read bit_2 can be obtained from the $BL_5$ and $BL_3$, respectively.

As mentioned above, besides the read voltages applied to the shared bit line ($BL_4$), the bit line_1($BL_5$), and the bit line_2($BL_3$), a fourth bit line that is adjacent to either the bit lin_1 and the bit line_2 can be applied with a read voltage for the sake of easy decoding. In this embodiment, the fourth bit line is the bit line $BL_2$ that is applied with a read voltage of 0V. In another embodiment, the fourth bit line can be the bit line $BL_6$.

FIG. 6(a)-(h) show an exemplary method for fabricating a NAND type multi-bit charge storage memory array in accordance with one embodiment of the present invention. For the purpose of clear illustration, only the fabrication process of two charge storage memory cells of two adjacent memory strings along with one bit line, one word line, and one contact is illustrated.

Figure 6A:
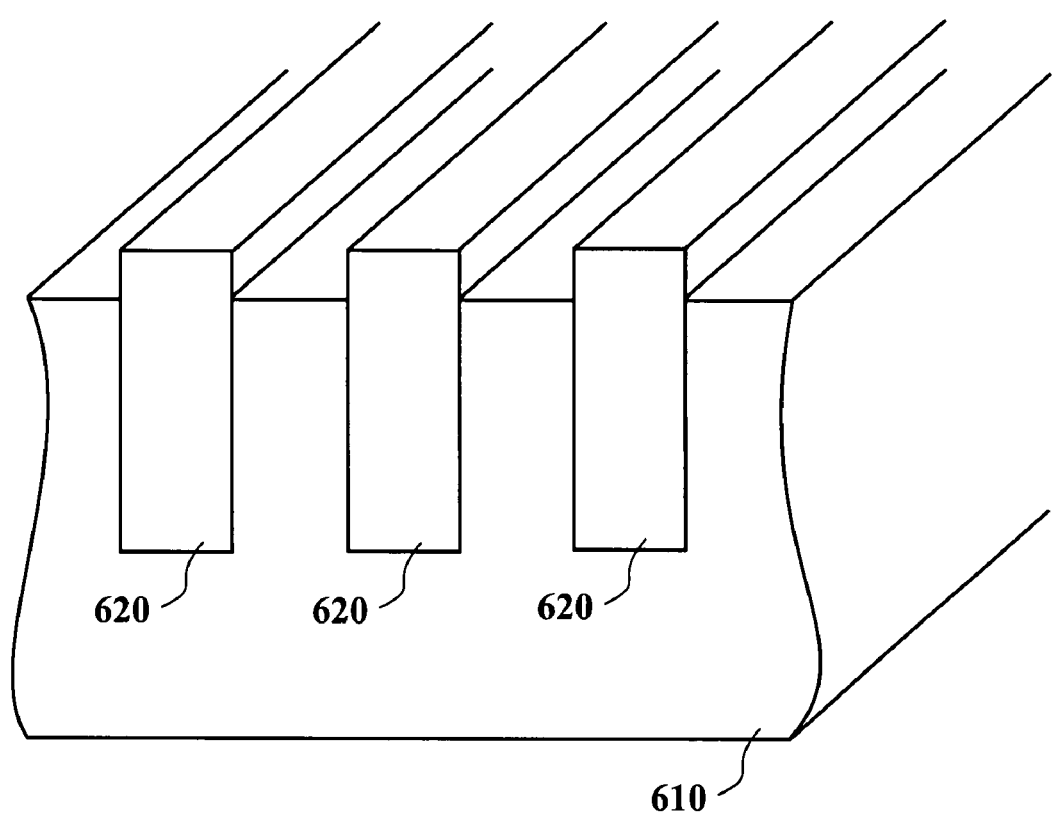
FIG. 6(a)-(h) illustrates an exemplary method for fabricating a NAND charge storage memory array in accordance with one embodiment of the present invention.
Figure 6B:
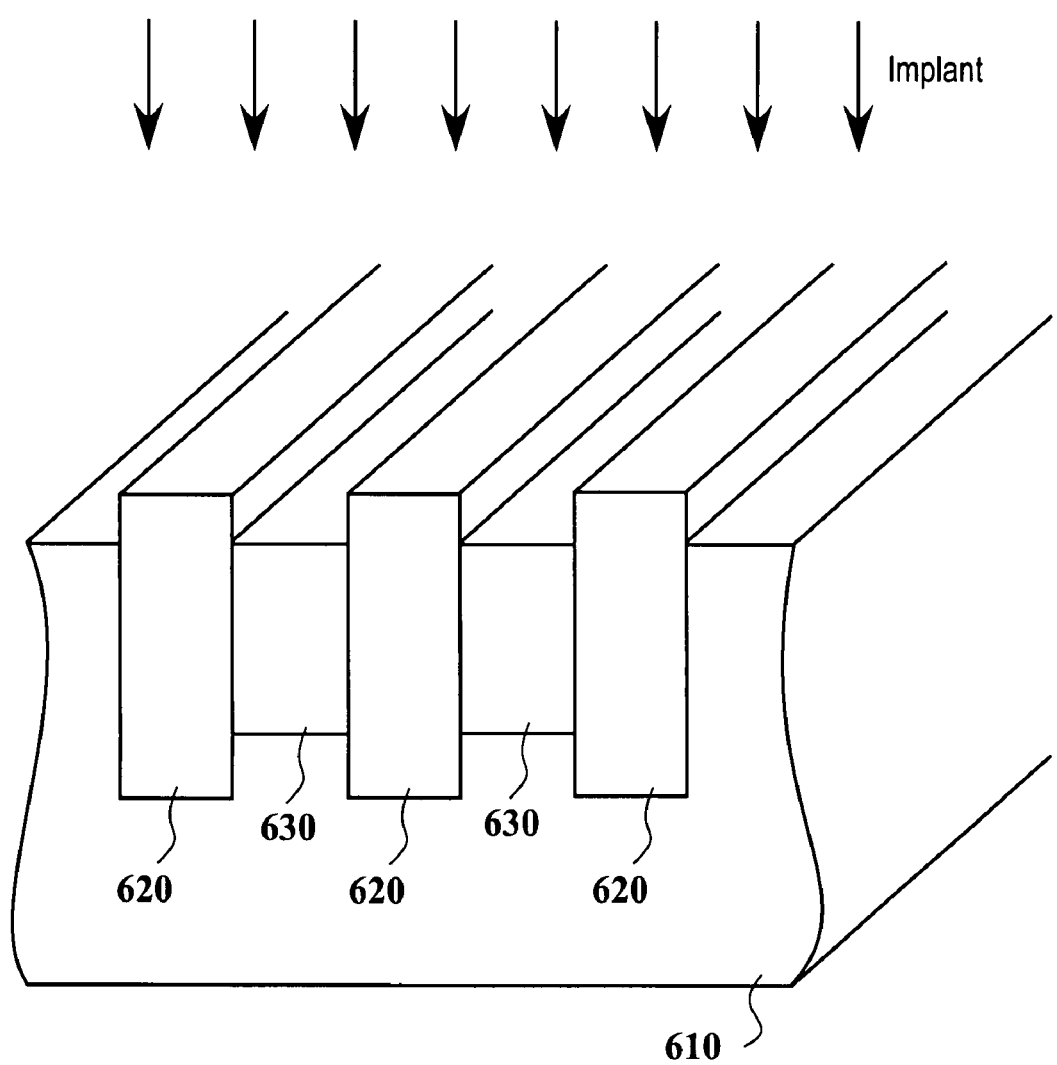
Figure 6C:
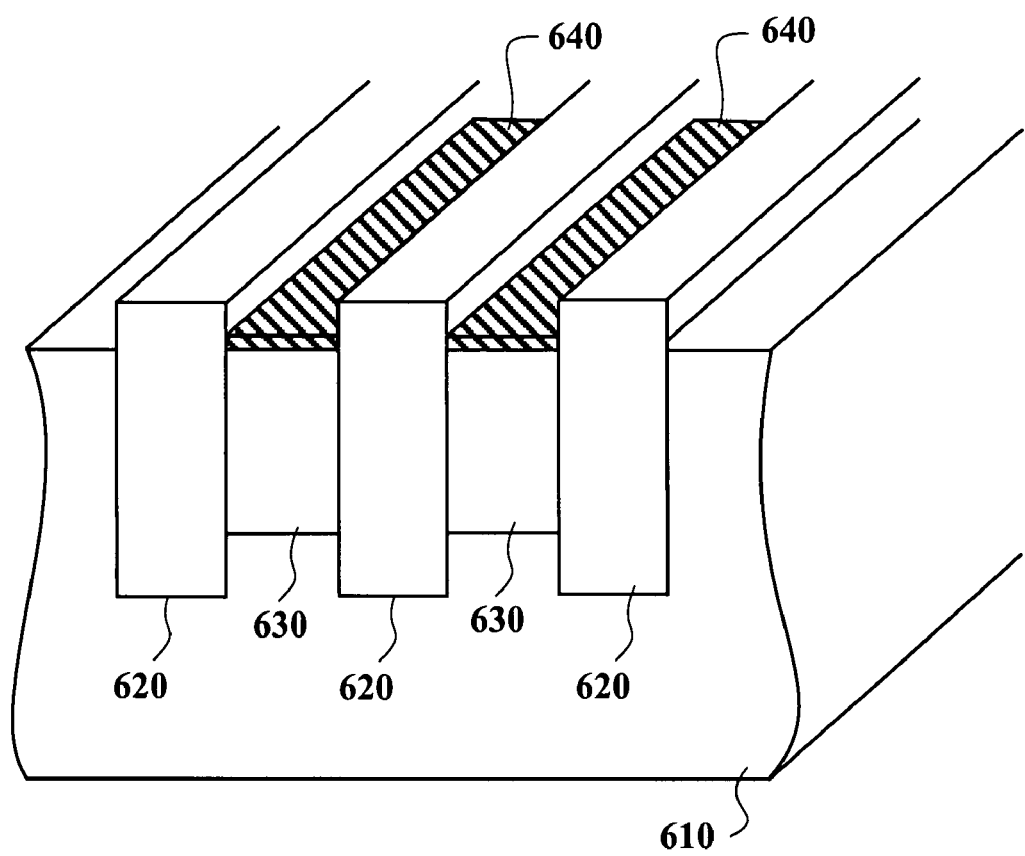
Figure 6D:
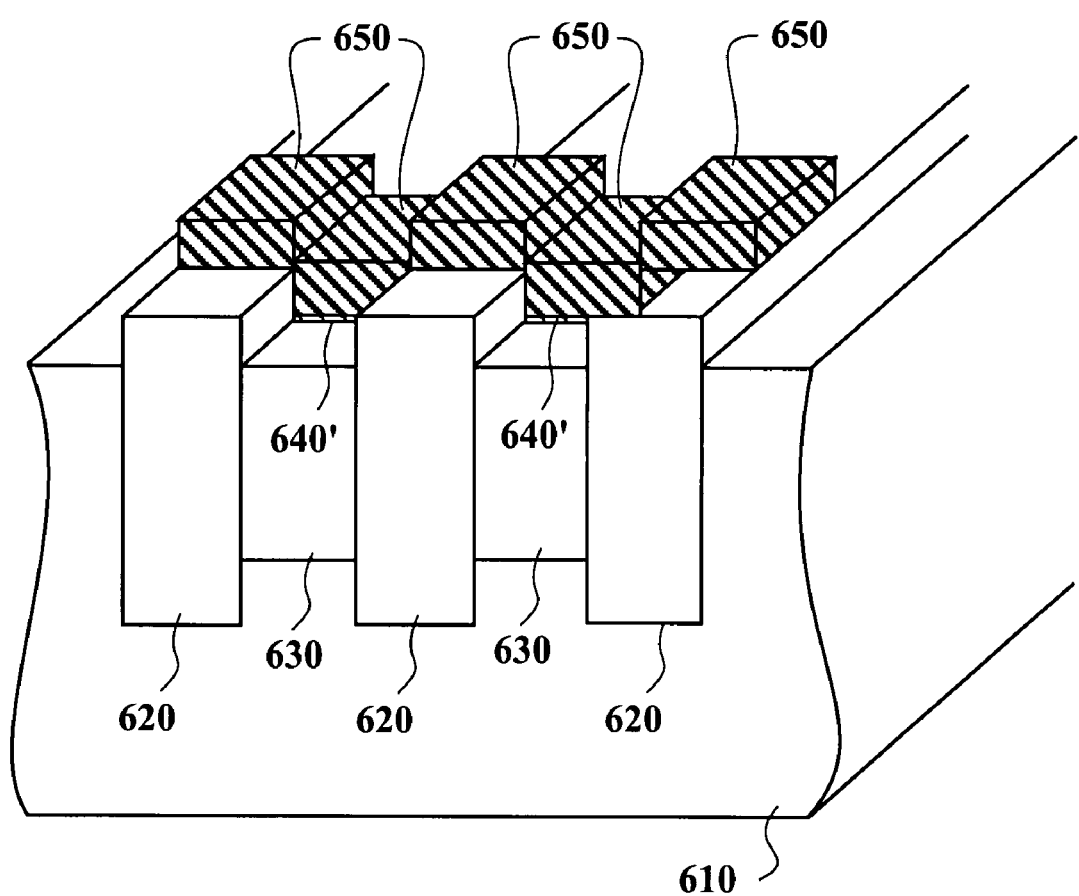

As shown from FIG. 6(a) to FIG. 6(d), a substrate 610 is patterned such that three oxide regions 620 are formed on the substrate 610. The substrate 610 is then implanted to form two P wells 630 on the substrate 610 between the oxide regions 620. Next, a charge layer 640 is formed over each of the P wells 630 and between the oxide regions 620. Afterwards, a layer of polysilicon is formed over the charge layers 640 and the oxide regions 620. As indicated in FIG. 6(d), the layer of polysilicon and the charge layers 640 are patterned and etched such that two charge storage layers 640' and a transversal polysilicon line 650 are formed, resulting in the exposure of the portions of the P wells 630 that are located at the front and the back of the charge storage layers 640'. The polysilicon line 650 is a word line.

Figure 6E:
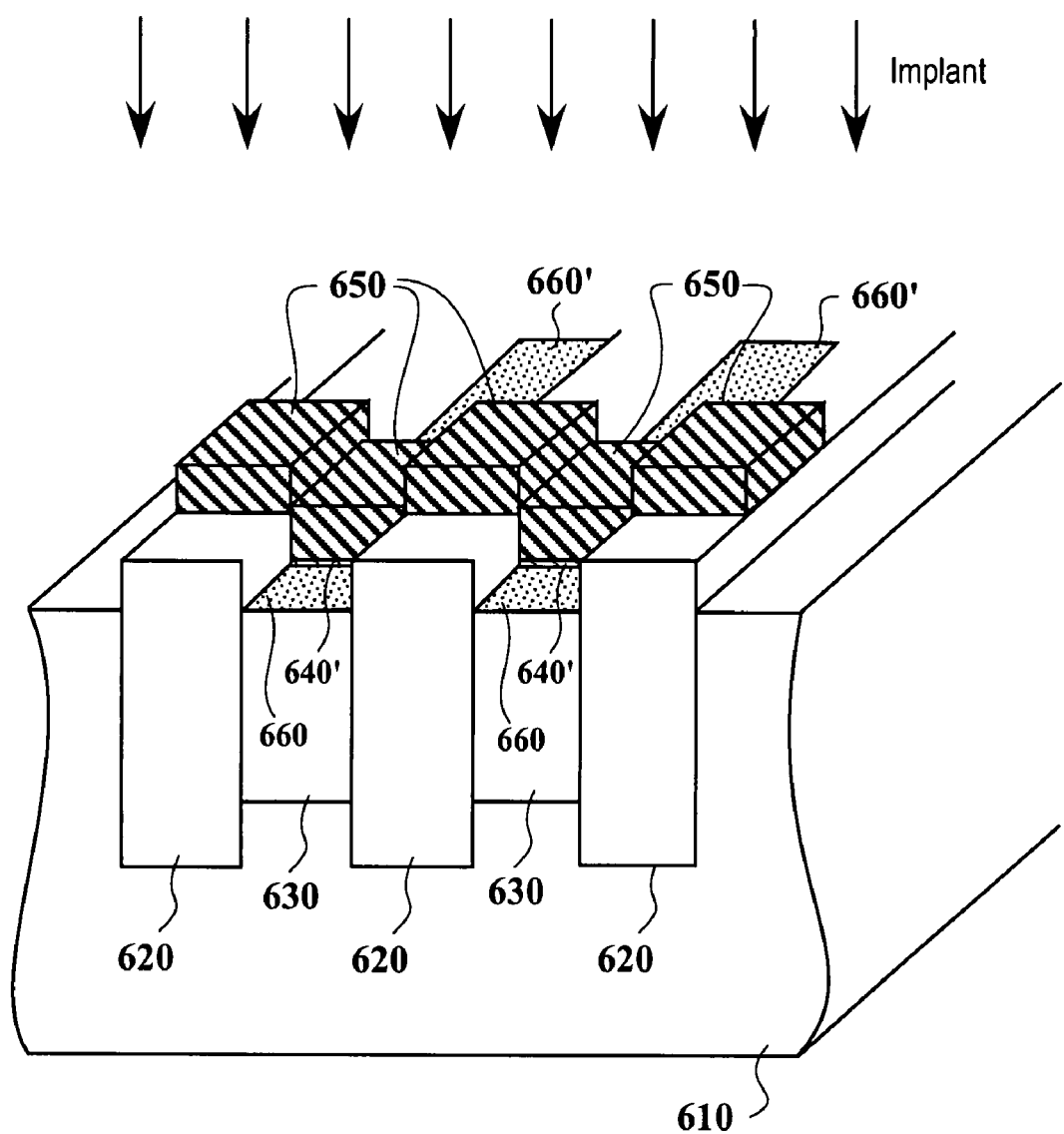
Figure 6F:
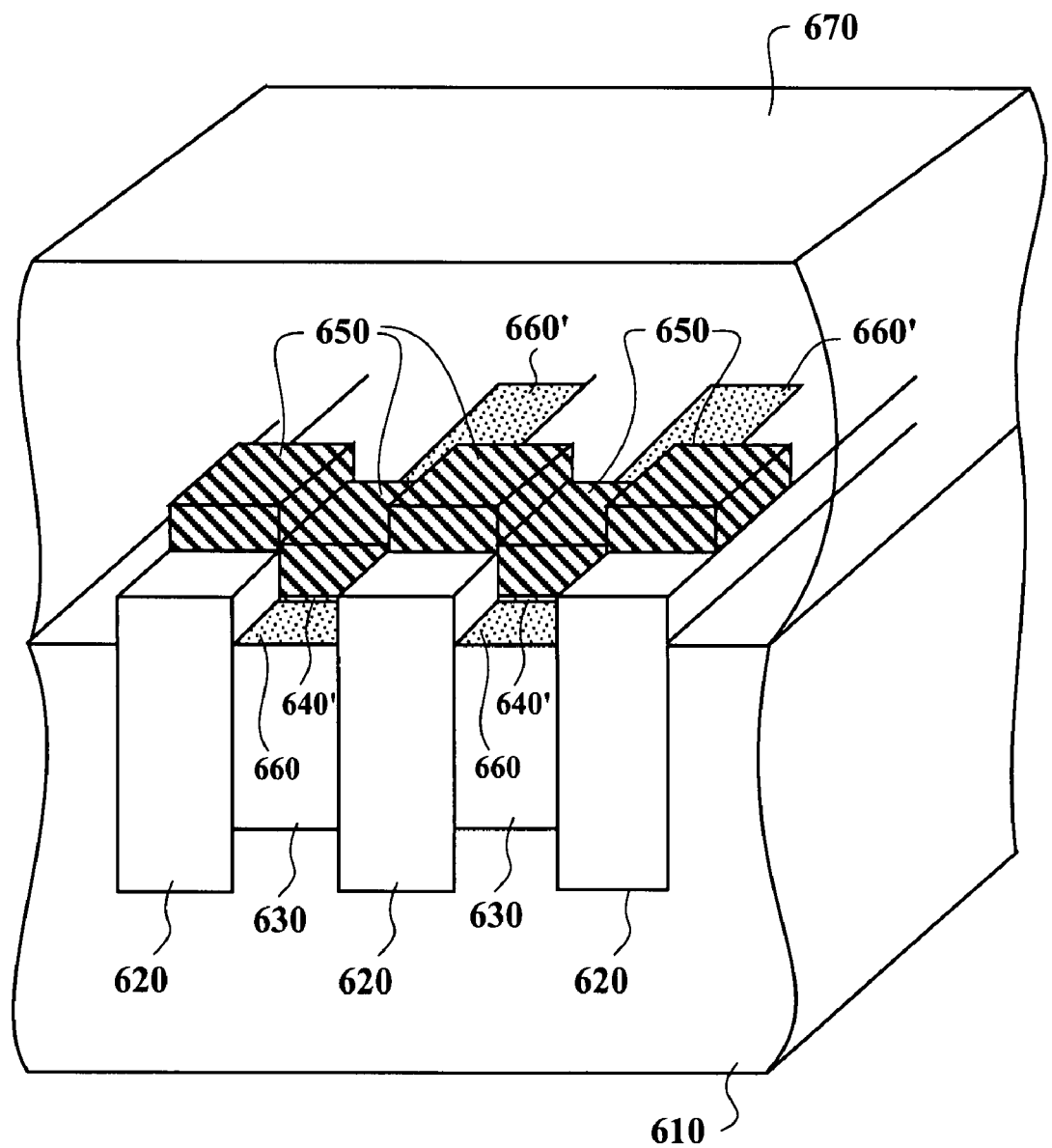
Figure 6G:
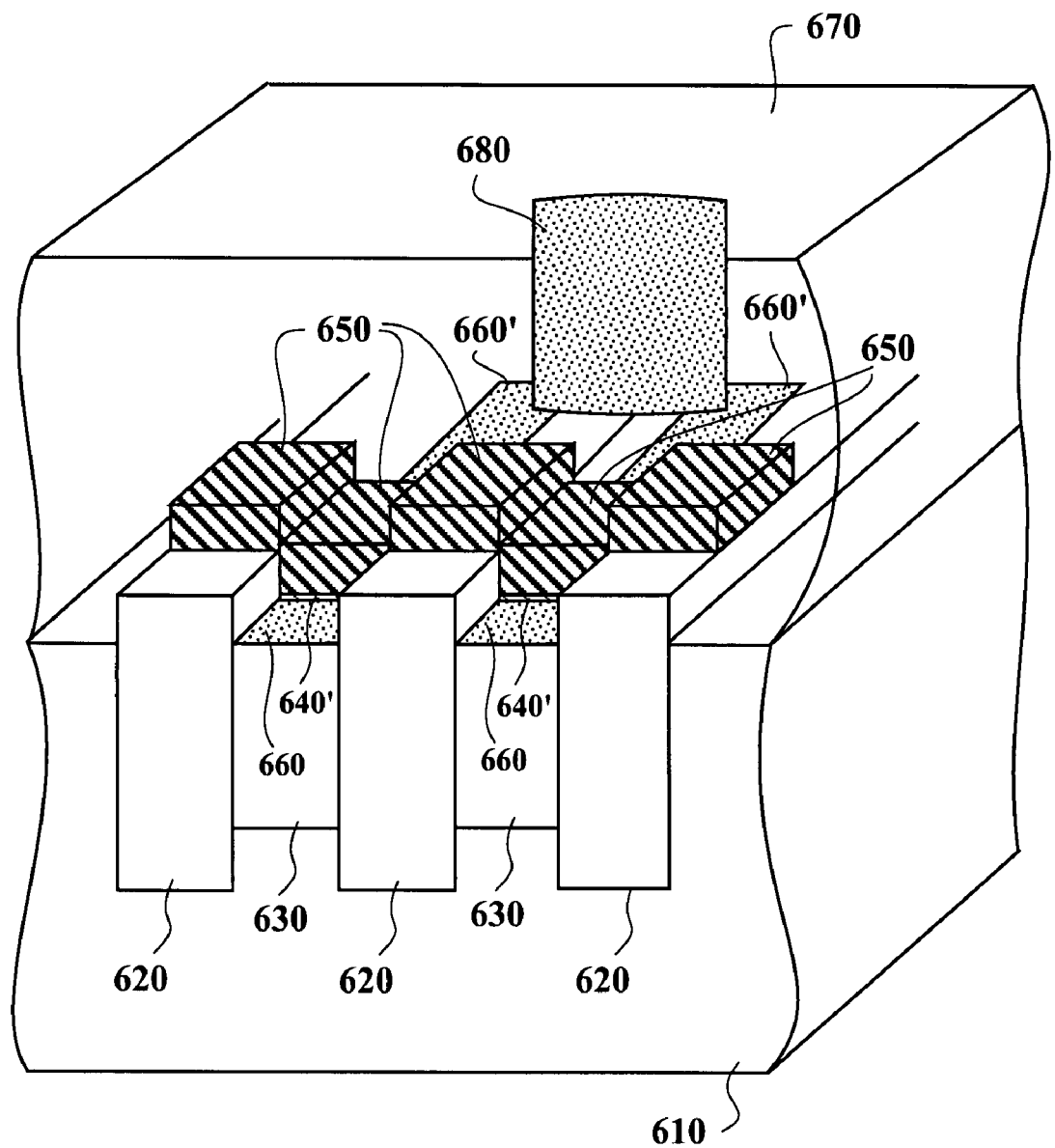
Figure 6H:
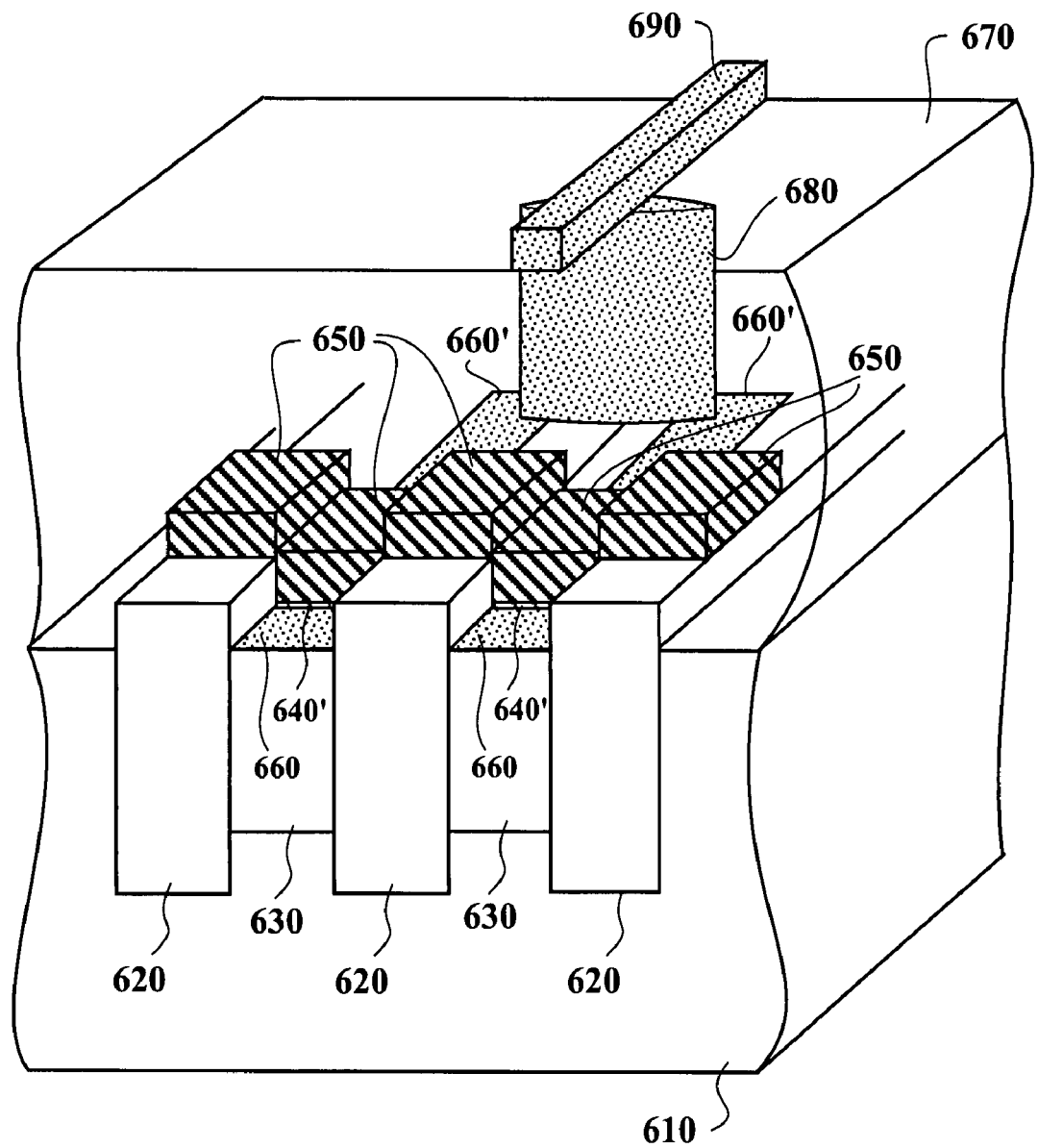

In FIG. 6(e), an implantation process is performed to form N+ doped source/drain regions 660 and 660' on the exposed portions of the P wells 630. The N+ doped source/drain regions 660 and 660' are located at the front and the back of the charge storage layers 640', respectively. Next, a thick oxide layer 670 is formed, as shown in FIG. 6(f), over the substrate 610, the polysilicon line 650, the N+ doped source/drain regions 660 and 660', and the oxide regions 620. Then, the oxide layer 670 is patterned and etched such that a contact 680 can be formed through the oxide layer 670 to connect the two N+ doped source/drain regions 660'.

At this point, reference should be made the above figures, in which contacts are formed in an alternating arrangement. For instance, FIG. 4 shows the contacts being formed such that one is at one end, and the next on the adjacent line is at the other end. This is further illustrated with reference to the circuit diagram of FIG. 2. Consequently, as noted above, the adjacent bit lines shown have their contacts alternatively located at the opposite ends of the two adjacent bit lines. Thus, the contact pitch between bit lines is doubled, as compared with the contact pitch of the conventional NAND floating gate memory array. If viewed from the standpoint of three contacts, a first contact will be at a first end, the second adjacent contact will be at a second end and the third adjacent contact will be at the first end. In a following process step, a metal layer is formed over the oxide layer 670 and the contact 680. The metal layer is then patterned and etched to form a vertical bit line 690 for this NAND charge storage memory array.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modification s according to the particular purpose contemplated. The scope of the invention is intended to be defined by the claims appended hereto and their equivalents.

What is claimed is:

1. A memory, comprising:

a first memory string and a second memory string, each of the first memory string and the second memory string including one or more memory cells being connected in series to form a memory cell string, each of the memory cells comprising a layer for storing a charge localized at one side, the memory cells further comprising two adjacent bits belonging to the first memory string and the second memory string respectively;

a first select transistor connected in series to a first end of each of the first and second memory cell strings;

a second select transistor connected in series to a second end of each of the first and second memory cell strings;

a shared bit line connected with the first memory string and the second memory string through a first contact, the shared bit line being applied a voltage for programming simultaneously the two adjacent bits belonging to two memory cells;

a first bit line connected with a first end of the first memory string through a second contact; and a second bit line connected with a second end of the second memory string through a third contact, wherein the first select transistor of each of the first memory string and the second memory string is controlled by a first select transistor control line, and the second select transistor of each of the first memory string and the second memory string is controlled by a second select transistor control line.

2. The memory as recited in claim 1, wherein the charge storage memory cells are programmed by hot-hole injection nitride electron storage (PHINES) cells.

3. The memory as recited in claim 1, wherein the charge storage memory cells are nitride read only memory (NROM) cells.

4. The memory as recited in claim 1, wherein the first memory string and the second memory string have identical number of memory cells which are arranged in columns and rows.

5. The memory as recited in claim 1, wherein the first select transistor of each of the first memory string and the second memory string is arranged in a first row, and the second select transistor of each of the first memory string and the second memory string is arranged in a second row.

6. The memory as recited in claim 1, wherein the first and second strings form NAND memory array.

\* \* \* \* \*